(12) United States Patent
Von Soosten et al.

(10) Patent No.: US 12,334,617 B2
(45) Date of Patent: Jun. 17, 2025

(54) MULTI-CHANNEL FILTER COMPRISING PLURAL ELONGATE SIGNAL TRACKS COVERED BY ELECTROMAGNETICALLY ABSORBING MATERIAL AND THE SIGNAL TRACKS ARE SEPARATED BY ELONGATE SHIELDING TRACKS

(71) Applicant: QM Technologies ApS, Ballerup (DK)

(72) Inventors: Merlin Von Soosten, Copenhagen S (DK); Ferdinand Kuemmeth, Copenhagen N (DK); Anders Kuhle, Vanlose (DK); Martin Skjodt, Rodovre (DK); Jonatan Kutchinsky, Ballerup (DK); Peter Ulrik Kann, Farum (DK)

(73) Assignee: QM TECHNOLOGIES APS, Ballerup (DK)

( * ) Notice: Subject to any disclaimer, the term of this patent is extended or adjusted under 35 U.S.C. 154(b) by 274 days.

(21) Appl. No.: 17/794,342

(22) PCT Filed: Jan. 22, 2021

(86) PCT No.: PCT/EP2021/051482
§ 371 (c)(1),
(2) Date: Jul. 21, 2022

(87) PCT Pub. No.: WO2021/148621
PCT Pub. Date: Jul. 29, 2021

(65) Prior Publication Data
US 2023/0046599 A1    Feb. 16, 2023

(30) Foreign Application Priority Data
Jan. 24, 2020  (EP) .................................. 20153638

(51) Int. Cl.
*H01P 1/203* (2006.01)
*H01P 11/00* (2006.01)
(Continued)

(52) U.S. Cl.
CPC .......... *H01P 1/203* (2013.01); *H01P 1/20381* (2013.01); *H01P 11/007* (2013.01);
(Continued)

(58) Field of Classification Search
CPC ..... H01P 1/203; H01P 1/20381; H01P 11/007
(Continued)

(56) References Cited

U.S. PATENT DOCUMENTS 6,741,142 B1    5/2004  Okazaki et al.
7,893,792 B2    2/2011  Hwang et al.
(Continued)

FOREIGN PATENT DOCUMENTS

CN    108365310 A    8/2018
CN    108365311 A    8/2018
(Continued)

OTHER PUBLICATIONS

Mueller et al., "Printed Circuit Board Metal Powder Filters for Low Electron Temperatures," Review of Scientific Instruments, vol. 84, No. 4, Apr. 30, 2013, pp. 044706-1-044706-7.
(Continued)

*Primary Examiner* — Benny T Lee
(74) *Attorney, Agent, or Firm* — Workman Nydegger

(57) ABSTRACT

A multi-channel filter with a PCB with a first side with signalling tracks and shielding tracks between neighbouring signalling tracks. On the second side, a conductive layer is provided. The signalling tracks are covered by an electromagnetically absorbing material, such as a powder of an electrically conducting material is provided. The filter may have sections with reversed structure where the conductors are on the second side and the layer on the first side, where the conductors on opposite sides are interconnected. The filter may be rolled or folded.

12 Claims, 3 Drawing Sheets

(51) Int. Cl.
*H05K 1/02* (2006.01)
*H05K 1/11* (2006.01)

(52) U.S. Cl.
CPC ........... *H05K 1/0219* (2013.01); *H05K 1/028* (2013.01); *H05K 1/118* (2013.01); *H05K 2201/051* (2013.01)

(58) Field of Classification Search
USPC .......................................... 333/204
See application file for complete search history.

(56) References Cited

U.S. PATENT DOCUMENTS

| | | | |
|---|---|---|---|
| 8,159,313 | B2 | 4/2012 | Uchaykin |
| 9,521,743 | B2 | 12/2016 | Fischeneder et al. |
| 10,390,423 | B1 | 8/2019 | Olivadese |
| 2005/0007210 | A1* | 1/2005 | Fuke et al. .......... H01P 1/20381 333/204 |
| 2008/0284545 | A1 | 11/2008 | Keefe et al. |
| 2009/0046029 | A1 | 2/2009 | Nagai |
| 2013/0043961 | A1 | 2/2013 | Gebauer et al. |
| 2014/0266513 | A1* | 9/2014 | Abraham et al. ......... H01P 3/06 29/601 |

FOREIGN PATENT DOCUMENTS

| | | |
|---|---|---|
| EP | 0027047 A2 | 4/1981 |
| EP | 0027047 A3 | 10/1982 |
| JP | H06216606 A * | 8/1994 |

OTHER PUBLICATIONS

Karnaushenko et al., "Rolled-up Self-Assembly of Compact Magnetic Inductors, Transformers and Resonators," Cornell University Library, May 2, 2018, 19 pages.

Extended European Search Report from corresponding European Application No. 20153638.0, Jul. 29, 2020.

International Search Report from corresponding PCT Application No. PCT/EP2021/051482, May 19, 2021.

* cited by examiner

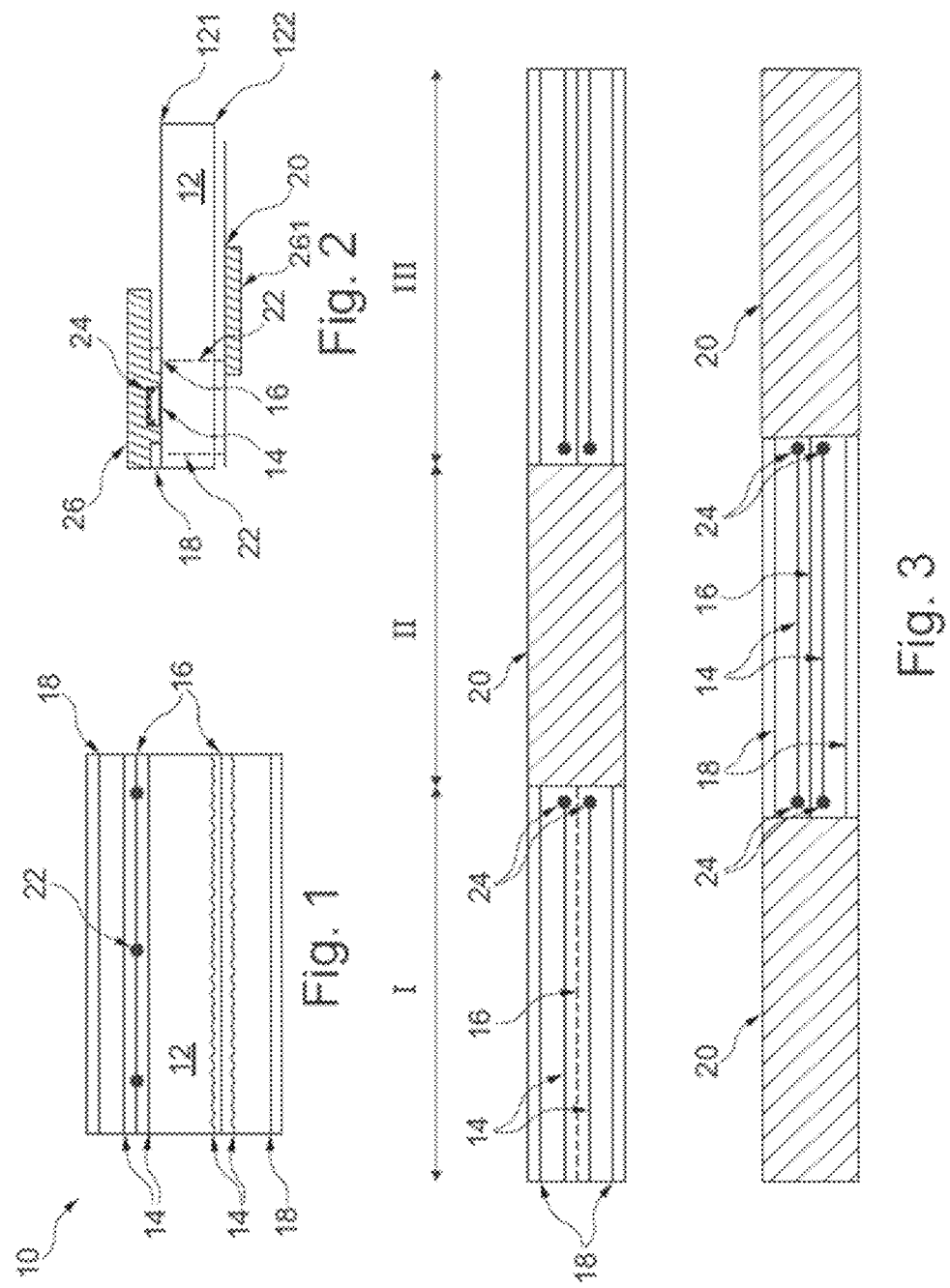

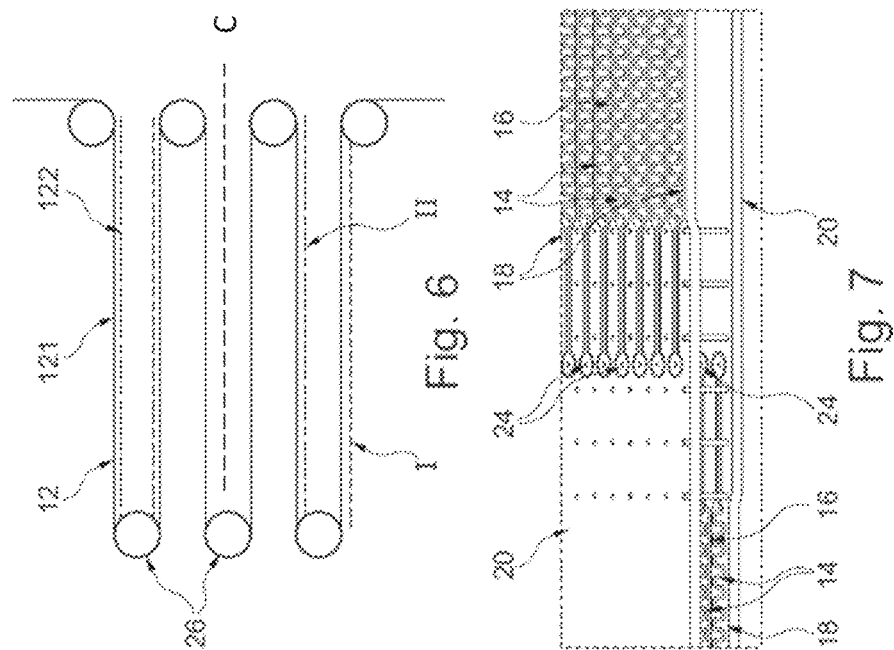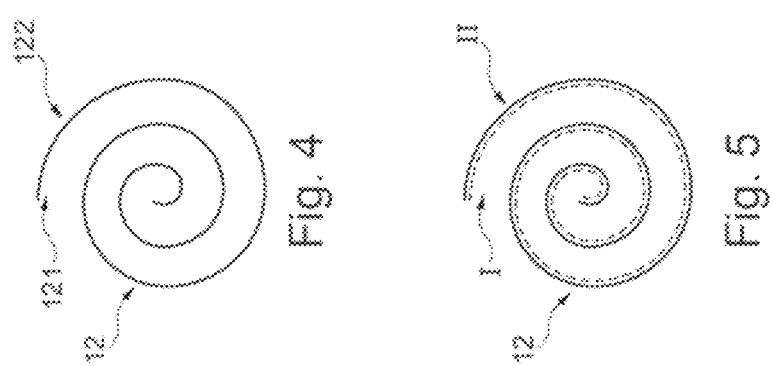

MULTI-CHANNEL FILTER COMPRISING PLURAL ELONGATE SIGNAL TRACKS COVERED BY ELECTROMAGNETICALLY ABSORBING MATERIAL AND THE SIGNAL TRACKS ARE SEPARATED BY ELONGATE SHIELDING TRACKS

BACKGROUND

The present invention relates to a multi channel filter for low temperatures, such as for reducing the effective electron temperature in signal guiding to/from quantum computer processors.

The project leading to this application has received funding from the European Union's Horizon 2020 research and innovation programme under grant agreement No 946372.

Filters may be seen in e.g. "Printed circuit board metal powder filters for low electron temperatures" by Mueller et al, Review of scientific instruments, 84, 044706 (2013), "Rolled-up self-assembly of compact magnetic inductors, transformers and resonators", Karnaushenko et al, arxiv.org, Cornell University Library, 2 May 2018, issued U.S. Pat. No. 8,159,313, published US Patent Application no. 2008/0284545, issued U.S. Pat. No. 10,390,423, issued U.S. Pat. No. 7,893,792, published US Patent Application no. 2013/0043961, and issued U.S. Pat. No. 9,521,743.

SUMMARY OF THE INVENTION

In a first aspect, the invention relates to a multi-channel filter comprising:
a printed circuit board (PCB) comprising:
a plurality of first elongate signal tracks, each signal track formed by an electrically conducting path on a first surface of the printed circuit board, each first signal track is not galvanically connected to any other first signal track,
one or more first elongate shielding tracks, each signal track formed by an electrically conducting or absorbing path on the first surface, one of the first elongate shielding track(s) being positioned between each pair of neighbouring first elongate signal tracks,
a first electrically conducting or absorbing layer on a second surface of the printed circuit board, the first and second sides being opposite sides of the printed circuit board, and
a first electromagnetically absorbing material covering the first elongate signal tracks.

In the present context, a filter is a circuit which is configured to adapt a signal travelling through the filter. In the present context, the filter may be adapted to reduce the electron temperature of signals transported thereby. In addition, the filter may be a low pass filter if desired.

The present filter is a multi-channel filter having a plurality of signal tracks. Each signal track may transport a signal or a flow of electrons.

The signal tracks are provided on a printed circuit board which may be an element having the signal tracks on a surface thereof. Each signal track is elongate, meaning that it has a length which is longer, such as at least 10 times longer, than its width. The signal tracks may be provided on a surface of the PCB, such as attached thereto. The PCB may have a core material of a material which is not electrically conducting, such as a material which has a conductivity of no more than 0.0001 S/m, such as no more than 0.001 S/m, at room temperature and/or at temperatures below 100 K, such as at temperatures below 1 K. Suitable core materials may be polymers, PTFE, SiO, ceramics, glass, semiconductor materials or composites. Naturally, the PCB may have a core of a flexible material, such as a material easily permanently deformed, such as a metal. In that situation, the PCB may be permanently deformed to maintain the rolled/folded shape.

The signal track is/are made of an electrically conducting material, such as a material having a conductivity of at least 100 S/m, such as at least 200 S/m, such as at least 300 S/m, such as at least 500 S/m, such as at least 1000 S/m at room temperature and/or at temperatures below 100 K or below 1 K. Suitable materials may be: Cu, Au, Ag, C, Al or the like.

The signal tracks may be straight or meandering. Preferably, the signal tracks are more or less parallel so that each signal track extends from one end or portion of the PCB to another end or portion thereof. Each signal track is not galvanically connected to any other signal track. Then, a signal travelling in one signal track may not be able to directly travel to another signal track. The lack of a galvanic connection may mean that a signal in one signal track may be substantially attenuated if transferred to another signal track. Between two signal tracks, a resistance may exist of 100 MOhm or more, such as 1 GOhm or more, such as 10 GOhm or more, such as 100 GOhm or more at room temperature or at less than 1 K. In addition, preferably the signal tracks do not overlap. Actually, it may be desired to use, for one or more signal tracks, a resistive material with a conductivity less than e.g. 10 S/m in (part of) the signal line. In this manner, the signal track will operate as an in-line RC filter with the powder as the capacitive medium.

One or more first elongate shielding tracks are provided. Each shielding track is each formed by an electrically conducting or absorbing path on the first surface. Preferably, the shielding tracks are made of an electrically conducting material, such as a material having a conductivity of at least 100 S/m, such as at least 200 S/m, such as at least 300 S/m, such as at least 500 S/m, such as at least 1000 S/m at room temperature and/or at temperatures below 100 K or below 1 K. Suitable materials may be: Cu, Au, Ag, C, Al or the like. Alternatively, a shielding track may comprise an absorbing material. An absorbing material may be powder of an electrically conducting or semiconducting material or a super conducting material. A shielding track may be a solid material or a porous material, such as a powder. This material may be provided on a surface of the PCB. Alternatively, the PCB may, at the position of a shielding track, have a groove or an opening or channel through which material forming the shielding track, such as if made of or comprising powder, may extend from the first surface, such as between the signal tracks, and into the PCB material and potentially all the way to the first electrically conducting or absorbing layer.

One of the first elongate shielding track(s) is positioned between each pair of neighbouring first elongate signal tracks. Preferably, a first shielding track is provided between all pairs of neighbouring signal tracks.

The function of the shielding track is to prevent or reduce cross talk between neighbouring signal tracks. Naturally, a signal travelling in one signal track may create cross talk to a neighbouring conductor so that the neighbouring conductor will carry a signal similar to that in the one signal track. This is not desired, and the operation of the shielding track(s) is to prevent such cross talk between signal tracks.

Preferably, the shielding tracks extend as far along the PCB as the signal tracks. Thus, if the signal tracks extend from one end or portion of the PCB to another end/portion, so may the shielding tracks. However, the shielding tracks do not need to be continuous along the length of the signal tracks. Shielding tracks may be defined as a dotted or dashed line with individual portions, which are preferably each connected to each other and/or the conducting layer in order to remain grounded and thus provide a desired shielding.

Also, it is preferred that each shielding track is positioned directly between two adjacent or neighbouring signal tracks. Thus, the shielding tracks(s) may be straight conductors provided between the signal tracks or meandering tracks, if desired. If the signal tracks are meandering, such as with a constant distance between them, such as perpendicularly to a general longitudinal direction thereof or a straight line from the one end/portion to the other end/portion, the shielding track between these may have the same shape and thus have the same distance to the signal tracks, such as in the same perpendicular direction.

A first electrically conducting or absorbing layer is provided on a second surface of the printed circuit board. In this connection, the first and second sides are opposite sides of the PCB. Preferably, these two sides are the two main sides or the two sides of the PCB with the largest surfaces. PCBs often are flat and thin elements having two main sides and a low thickness compared to any dimensions of the main sides.

The first side of the PCB preferably has a largest dimension being no less than 10 times, such as no less than 100 times, larger than the dimension perpendicular to the first side, often being the thickness.

Preferably, the first electrically conducting or absorbing layer covers or overlaps, such as completely encompasses, when projected on to the first surface or a plane parallel to the first surface, the signal tracks also projected on to the plane. In this manner, the first conducting/absorbing layer will ensure that no signals from the signal tracks are able to leave the filter in the direction from the signal tracks through the PCB, such as in a direction perpendicular to the surface of the PCB.

Finally, a first electromagnetically absorbing material is covering the first elongate signal tracks. The electromagnetically absorbing material may be provided on a side of the PCB with the first signalling tracks, such as adhered to that side of the PCB.

In the present context, an electromagnetically absorbing material may comprise a powder, nanoparticles, fibres, sheets, nanotubes, Buckminsterfullerene(s), wires or the like-combined or not, of a metal, such as Cu, Au, Ag, Al, Stainless Steel, Brass or the like, a doped or undoped semiconductor or semiconductor composites, such as of Si, Ge, C, Sb, InSb or combinations thereof, or of graphene, graphite or carbon, such as carbon nanotubes (multi walled if desired). In addition, or alternatively, the electromagnetically absorbing material may comprise a magnetic material, such as Iron oxides, Ferrite, Magnetite or other magnetic materials. Another type of absorbing material is a super conductor.

The powder/nanoparticles/fibres/sheets/nanotubes or the like preferably comprises a material with a conductivity of at least 1 S/m, such as at least 10 S/m, such as at least 100 S/m at room temperature and/or a temperature below 100 K or below 1 K.

The powder/nanoparticles/fibres/sheets/nanotubes or the like may have particles with a particle size, such as a mean value of the largest dimension of the particles, below 1000 µm, such as below 500 µm, such as below 250 µm such as below 100 µm, such as below 50 µm, such as below 25 µm.

In addition, the electromagnetically absorbing material may comprise a structural matrix in addition to the above material(s), such as a metal or a resin, such as an epoxy resin, a polymer (Silicone, Poly(methyl methacrylate), Vinyl or the like), a ceramic (AlO, HfO or the like). The matrix may act to fix the above material(s) in relation to each other or in relation to e.g. the signal tracks or the PCB.

In addition, the structural matrix may have the function of optimizing the electromagnetic absorption and the thermal conductivity of the electromagnetically absorbing material. For example, the thermal conductivity of the matrix may be adapted to arrive at a desired combined thermal conductivity of the electromagnetically absorbing material. Also, the electromagnetic absorption may be tailored by the choice of the dimensions, concentration of and material of the powder, fibres, sheets or the like as described above.

The electromagnetically absorbing material may be attached to the PCB, such as by a glue or the like. Naturally, the electromagnetically absorbing material may be attached to the PCB by the electromagnetically absorbing material itself being adhesive or having been made adhesive, such as if the above structural matrix has this property. It is preferred, however, that the signal tracks are not galvanically connected to each other through the electromagnetically absorbing material. In some embodiments, the electromagnetically absorbing material may comprise the above structural matrix, such as a glue or adhesive, such as epoxy resins, silicones or the like, so that it may be applied on to the PCB and allowed to dry/solidify/harden.

Below, different alternative manners of providing the absorbing material are described.

The interaction between the electrons in the signal tracks and the electromagnetically absorbing material may reduce the electron temperature of the signals in the signal tracks.

In one embodiment, the filter further comprises two first outer elongate shielding tracks positioned on the first surface, all first elongate signal tracks and all first elongate shielding tracks being positioned between the two first outer elongate shielding tracks. As described above, the shielding tracks may be made of a solid material and/or a porous material. In addition, or alternatively, an electromagnetically absorbing material may be provided at the sides of the PCB so that all signal tracks are provided between two portions of absorbing material.

The function of the outer tracks may be to prevent cross talk between the outermost signal tracks in situations where other conductors are provided close to the filter or PCB. In addition, in some embodiments described below, the PCB may be folded or rolled so that signal tracks would be positioned rather close. This, however, may not be problematic when the outer tracks are provided.

As with the shielding tracks, it is preferred that the outer tracks extend at least as far as the signal tracks along the overall direction thereof, such as from the first end/portion to the other end/portion.

In one embodiment, the filter further comprises one or more electrical connections between the first elongate shielding tracks and the first electrically conducting/absorbing layer. This may be obtained by providing electrical connections through the PCB from the first side, when the layer is electrically conducting, to the other side. In this manner, it may be ensured that the shielding tracks, and optionally also the first layer, are galvanically coupled and at the same potential.

Also, cooling may more easily be conveyed to the shielding tracks, both the first shielding tracks and any outer shielding tracks, via such connections. Such connections through a PCB are often called "vias". Cooling may also be transferred without providing a galvanic connection. Openings may be provided through the PCB in which thermal connection may be provided from the shielding tracks to cooling material, such as absorbing material, at the opposite side of the PCB.

In order to facilitate cooling of the filter, cooling elements or thermally conducting elements may be provided in the electromagnetically absorbing material. Such cooling elements preferably are thermally conductive, such as if made of a metal, and may extend from inside the electromagnetically absorbing material to close to an outer surface thereof or to surroundings of the material.

In the folded embodiment, the cooling element(s) may be provided in the absorbing material between two adjacent portions of the PCB. In the rolled embodiment, the cooling element may be a layer provided in the absorbing material between adjacent windings of the roll.

In that or another embodiment, one or more portions of the PCB, such as one or more portions thermally and/or electrically connected to the first electrically conducting/absorbing layer, may extend away from the PCB, potentially through a layer of absorbing material, to surroundings of the filter. Such portion(s) may then be cooled, transferring cooling into the roll/folded structure.

The absorbing material may be provided as a solid element, such as one or more monolithic elements which is/are provided at the PCB. The solid element(s) may be biased toward the PCB, such as using a spring element, or may be attached to the PCB such as using an adhesive. In the folded version, the PCB may be folded around an absorbing element, such as around multiple absorbing elements which will then each be provided between adjacent portions of the PCB.

Such solid elements may be cast, moulded or printed, such as screen printed or 3D printed.

The element may be hard/unflexible or soft/flexible. A soft or flexible element may be provided at the PCB before rolling/folding so that the element is rolled/folded with the PCB to be provided between neighbouring windings or portions of the rolled/folded PCB.

Another aspect of the invention relates generally to a PCB comprising at least one electrical conductor, rolled, folded, straight or having any other shape, and which is attached to a solid element which is electromagnetically absorbing. This PCB and electromagnetically absorbing material may be as described below and above, and this aspect clearly may be combined with any of the other aspects, embodiments, situations and the like.

Alternatively, the absorbing material may be screen printed or painted/lacquered directly on the PCB. An aspect of the invention relates to a PCB as described in relation to any of the other aspects, embodiments and situations of the application, onto which is screen printed, painted or lacquered an electromagnetically absorbing material, such as a material comprising an adhesive and a powder of an absorbing or conducting material. This material may be as described above and below.

Another alternative is one where a slurry of particles and a liquid, such as an adhesive or the like, is added to or at the PCB, often in the rolled/folded position, where the liquid of the slurry has a sufficiently low viscosity to allow the particles to move according to gravity (or a force generated such as by rotation) and settle in one portion of the volume receiving the slurry. Often, the particles have a density larger than that of the liquid. In this manner, the concentration of the powder may be higher in this portion after settling than the concentration in the initial slurry. Yet another aspect of the present invention relates to a method of providing an electromagnetically absorbing element onto or at a PCB comprising at least one conductor or signal track, the method comprising adding a slurry, comprising an adhesive liquid and a powder of an electromagnetically absorbing or electrically conducting material, at or on the PCB and allowing the powder to settle in a portion of a volume into which the slurry is provided, before the adhesive sets or hardens (and thus prevents further movement of the powder). Clearly, this aspect may be combined with any of the other aspects, embodiments, situations or the like. The method may further comprise the later step of removing a portion of the set adhesive in a volume away from or different from the portion in which a main portion of the powder has settled. Often, the PCB will be provided in a container into which the slurry is provided. The PCB may be provided below a height, in the container, to which the slurry is filled, so that an upper part of the set adhesive may be removed without removing part of the PCB.

A preferred embodiment of the filter further comprises a second electromagnetically absorbing material in contact with the first electrically conducting/absorbing layer. Naturally, the second electromagnetically absorbing material may be the same as the first electromagnetically absorbing material. The second electromagnetically absorbing material may have the above properties and may comprise the same electrically conducting or semiconducting material as the first electromagnetically absorbing material. The second electromagnetically absorbing material may be attached to the first layer, such as in the same manner as the first electromagnetically absorbing material may be attached to the PCB or first insulating material. The second electromagnetically absorbing material may be used for transporting cooling to the first electrically conducting/absorbing layer, which may distribute this and feed it onwards to the shielding tracks.

It may be desired that the first electrically conducting/absorbing layer is in galvanic and/or thermal contact with the second electromagnetically absorbing material. This provides a better energy/cooling transfer, as the electromagnetically absorbing material may then be connected or connectable to a cooling surface in a system wherein the filter is used.

In general, it may be desired that the PCB is thin. One reason may be that it is easier to transport cooling through a thinner material. Another reason is that when the PCB is thin, the distance across the width between the first layer and the shielding tracks and outer tracks is low. Then, the gaps for signals from the signal tracks to escape or interfere with other signal tracks are narrower, providing a better shielding of the signal tracks. Additionally (see below) a thinner PCB may be more easily folded/rolled if desired.

In a preferred embodiment, the printed circuit board is flexible or bendable. In this connection, a flexible/bendable PCB is bendable 180 degrees over a radius of no more than 20 mm, such as no more than 10 mm, such as no more than 5 mm, such as no more than 3 mm, without damage to PCB core material and signal/shielding tracks. With a flexible PCB, the PCB may be rolled or folded so that the longest dimension (Euclidian) of the overall filter may be reduced. This is explained further below. Naturally, the flexibility of the PCB may be at any desired temperature, such as at room temperature, an elevated temperature or at a lower temperature. The PCB may be brought to the desired temperature where it is folded/rolled and then subsequently heated/cooled for mounting or the like if required.

Preferably, the filter has a first electrically insulating material covering the first elongate signal tracks. This insulating material may then be provided between the signal tracks and the first electromagnetically absorbing material. In this manner, interconnection of signal tracks via any conducting material in the electromagnetically absorbing material is prevented, and the first electromagnetically absorbing material may have a large concentration of the conducting or semiconducting material if desired. This first insulating material preferably has a conductivity below 0.001 S/m, such as below 0.0001 S/m at room temperature and/or below 100 K or below 1 K. Suitable materials may be polymers, plastics, glasses, ceramics or the like.

Also, the electromagnetically absorbing material may then be attached to or fixed to the first electrically insulating material instead of to the PCB.

In one embodiment, the printed circuit board comprises at least two sections along a longitudinal direction, wherein:

in a first section:
 the first elongate signal tracks and first elongate shielding tracks are provided at the first side of the printed circuit board and
 the first electrically conducting layer is provided on the second side of the printed circuit board,
in a second section adjacent to the first section, the filter comprises:
 a plurality of second elongate signal tracks each formed by an electrically conducting path on the second surface of the printed circuit board, each second signal track is not galvanically connected to any other second signal track,
 one or more second elongate shielding tracks each formed by an electrically conducting or absorbing path on the second surface, a second elongate shielding track being positioned between each pair of neighbouring second elongate signal tracks,
 a second electrically conducting or absorbing layer on the first surface of the printed circuit board, and
 a third electromagnetically absorbing material covering the second elongate signal tracks,
 and where a first signal track is connected to a second signal track.

Thus, the above filter structure is provided in the first section. In the second section, the structure is rotated or mirrored, so that the conductive surface is now on the first side of the PCB and the tracks on the other side. The relative positions of the tracks and surface of the second section are as those for the first section. Also, the functionality of the elements of the second section are as those of the first section.

Now, a first signal track is connected to a second signal track. This may be obtained by providing an electrical connection through the PCB material. Preferably, each first signal track is connected to a separate second signal track, so that each first signal track is connected to a second signal track and so that different first signal tracks are connected to different second signal tracks. Then, the number of second signal tracks may be the same as the number of first signal tracks.

Clearly, the first conducting layer may be connected to the second shielding tracks and/or the second outer tracks, as they are provided on the same side of the PCB. Similarly, the second conducting layer may be connected to the first shielding tracks and/or the first outer tracks.

A third powder is then provided covering the second elongate signal tracks to provide the same advantage, and/or have the above properties, as the first electromagnetically absorbing material covering the first signal tracks. The third electromagnetically absorbing material may be the same as, or have the same properties as, the first electromagnetically absorbing material and/or any electrically conducting or semiconducting material may be the same in the first and second electromagnetically absorbing materials.

If the second electromagnetically absorbing material is provided, it may be the same or connected as the third electromagnetically absorbing material, as these are provided on the same side of the PCB In addition, a fourth electromagnetically absorbing material may be provided in contact with the second electrically conducting/absorbing layer. Naturally, the fourth electromagnetically absorbing material may be the same as the first, second and/or third electromagnetically absorbing material. The fourth electromagnetically absorbing material may be attached to the first layer, such as in the same manner as the first/second electromagnetically absorbing material may be attached to the insulating material or first conducting layer.

This PCB may be used in interesting manners as will be described below.

In one embodiment, the flexible printed circuit board is folded to form at least two at least substantially parallel printed circuit board portions. In this manner, the second side of the PCB will face the first side. Preferably, the folding is provided between the first and second sections, so that one section will have the tracks face the electrically conductive layer of the other section. In this manner, the tracks of one section will not face the tracks of the other section. This again aids in reducing cross talk.

In another embodiment, the flexible printed circuit board is rolled into a roll. Rolling the PCB with the first side facing the inner portion of the roll, for example, again will ensure that the side with the tracks will face the side with the conducting layer.

However, simply rolling the PCB from one end to the other may have the disadvantage that one end of the signal tracks is engageable at the centre of the roll. If this is not desired, the PCB may first be folded as described and then rolled so that the folded portion is at the centre of the roll. The folding will again ensure that no side with the tracks faces another side with tracks, but now both ends of the signal tracks are available at the outer end of the roll. In this manner, immunity to (electro) magnetic noise may be obtained. If the roll is folded and rolled, the signals in the signal tracks will travel around the roll axis in both directions, reducing the noise picked up, if the roll is provided in a magnetic field.

In one embodiment, the first and/or second insulating material has a thickness 0.001-3000 μm, such as 0.005-1000 μm, such as 0.01-500 μm. such as 0.05-300 μm, such as 0.1-100 μm. The insulating material may be provided as an insulating material also formed around particles of the absorbing material.

A second aspect of the invention relates to a method of using the above-described filter, the method comprising:
 cooling the first electromagnetically absorbing material, the first electrically conducting signal tracks and the first shielding tracks to a temperature below 110 K, and
 feeding signals through the first electrically conducting signal tracks.

The cooling step may be obtained by having the electromagnetically absorbing material contact a cooling surface of a system comprising a receiver for the signals, such as a quantum processor core, which may also be desired cooled.

Another aspect of the invention relates to a filter, such as the above-described filter, comprising a printed circuit board comprising:

one or more elongate signal tracks each formed by an electrically conducting path on a first surface of the printed circuit board, an electrically conducting or absorbing layer on a second surface of the printed circuit board, the first and second sides being opposite sides of the printed circuit board, and wherein:

in a first section:

the elongate signal track(s) is/are provided on or at the first side of the printed circuit board and the electrically conducting or absorbing layer is provided on the second side of the printed circuit board, in a second section adjacent to the first section:

the elongate signal track(s) is/are provided on or at the second side of the printed circuit board and the electrically conducting or absorbing layer is provided on the first side of the printed circuit board, and where a signal track on the first side is connected to a signal track on the second side.

All above considerations, such as relating to the materials and their properties, may be used equally in this aspect.

The properties and positions of the signal tracks may be as described above.

According to this aspect, the shielding tracks and outer tracks are not required. They may, clearly, be provided if desired. Also, the electromagnetically absorbing material(s) and/or electrically insulating layers described above are not required but may be provided if desired.

The advantage of the present PCB is, as described above, that it, when it is flexible/bendable, may be folded and/or rolled. Folding will have the advantages described that the side with the tracks will only face the side with a layer, preventing cross talk. Folding and then rolling will additionally have the advantage that both ends of the signal tracks are available at the outer side of the roll.

BRIEF DESCRIPTION OF THE DRAWINGS

In the following, preferred embodiments will be described with reference to the drawing, wherein:

FIG. 1 illustrates a filter according to a first embodiment of the invention,

FIG. 2 illustrates the filter of FIG. 1 seen from the end,

FIG. 3 illustrates a filter according to a second embodiment of the invention,

FIG. 4 illustrates a filter according to a third embodiment of the invention,

FIG. 5 illustrates a filter according to a fourth embodiment of the invention

FIG. 6 illustrates a filter according to a fifth embodiment of the invention,

FIG. 7 illustrates an interface useful in the embodiment according to FIG. 3,

DETAILED DESCRIPTION OF VARIOUS EMBODIMENTS

Figure 9:
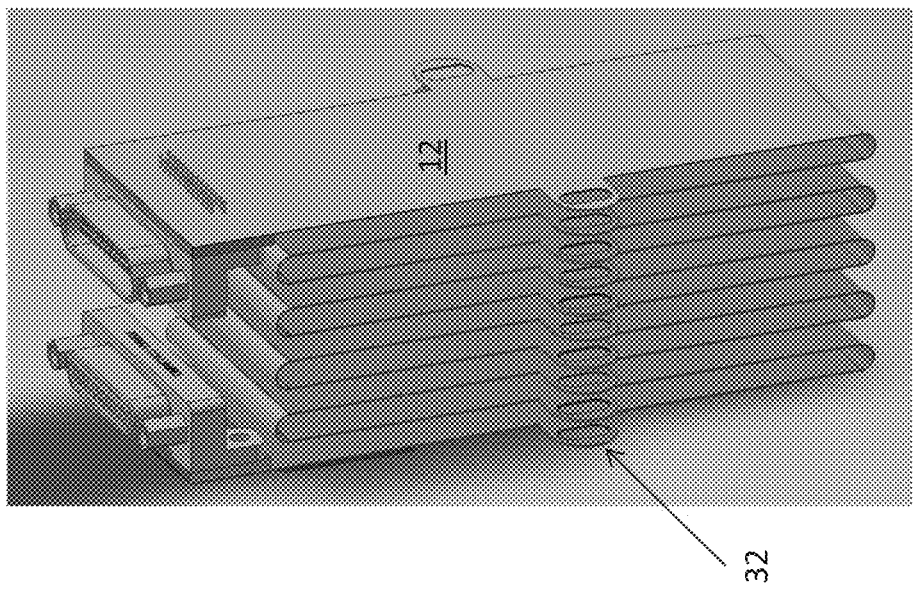
FIG. 9 illustrates a folded PCB structure with cooling fins.

In FIG. 1, a filter 10 is illustrated which is formed by a printed circuit board, or PCB, 12 having thereon a plurality of elongate signal tracks 14. A number of elongate shielding tracks 16 and two outer shielding tracks 18 may be provided along with a number of vias 22.

The tracks 14 are covered by an insulating material 24 (see FIG. 2), and an electromagnetically absorbing material 26 (see FIG. 2) of an electrically conducting material is provided on the insulating material.

A filter of this type is used for e.g. conditioning electric signals for a quantum computer processor. Then, the filter is cooled to less than 1 K, such as less than 10 mK.

In FIG. 1, two different shapes of the tracks 14 are illustrated—a straight shape and a sine-shaped or more meandering shape. Any shape or combination of shapes may be used. These include meandering and sine-shapes with multiples of different pitches, or random lines to reduce resonance effects.

Preferably, the signal tracks 14 extend at least substantially parallel so as to not overlap. Also, this may allow a shielding track 16 to be provided there between in order to prevent cross talk from one signal track 14 to another. Clearly, signal tracks 14 may be meandering and an equally meandering shielding track may be provided there between, but any shape, including straight, are useful.

Naturally, any number of signal tracks 14 may be provided. Preferably, a shielding track 16 is provided between each pair of neighbouring signal tracks 14. Also, preferably, outer tracks 18 are provided. Also, neighbouring tracks 14 may be aligned intentionally to reduce crosstalk and noise, i.e. by aligning a meandering pattern in phase or out of phase.

The tracks 14, as well as optional tracks 16 and 18, are provided on a first side 121 (see FIG. 2) of the PCB.

As shown in FIG. 2, on the other side 122 of the PCB 12, a conducting layer 20 may be provided which preferably covers all of the second side of the PCB or at least all of an area of the first side on which the tracks 14, 16 and 18 are provided (when projected on to a plane of the first side 121.

In this manner, the signal tracks 14 can be covered at all sides by the layer 20, the outer tracks 18, the shielding tracks 16 and the layer 20 and electromagnetically absorbing material 26.

FIG. 2 illustrates the filter structure 10 of FIG. 1 seen from the end, such as from the left. A number of the tracks and some of the electromagnetically absorbing material have been left out, but the upper outer track 18, signal track 14 and shielding track 16 are illustrated. It is seen that an electrically insulating material 24 is provided on the signal track 14 so as to prevent direct contact between the electromagnetically absorbing material and the signal track.

The insulating material may also be provided over the outer tracks 18 and/or the shielding tracks 16, but this is not required. A better cooling is seen when these tracks are in direct, galvanic contact with the electromagnetically absorbing material.

The same is the situation for the layer 20 which may be used also for cooling, so that it is preferably un-isolated and in galvanic contact with the electromagnetically absorbing material or another layer 261 of electromagnetically absorbing material at the second side 122 of the PCB 12.

Furthermore layer 20 may be thermally anchored to the cooling system to provide optimal cooling of the electromagnetically absorbing material in contact with the layer.

Often the electromagnetically absorbing material comprises a glue, such as epoxy, or other fluid so as to be fixed in relation to the layers and not shift during thermal cycling (heating and cooling). Also, later compaction of e.g. a loose powder may generate voids which could generate less cooling to certain elements in the filter structure.

In order to obtain a better cooling and shielding/grounding of the shielding tracks, vias 22 may be provided from the shielding tracks to the plane 20. Vias may also be provided from the outer tracks to the plane if desired.

The filter structure of FIGS. 1 and 2 is illustrated as a straight structure. However, as the PCB 12 is flexible, it is configured to be bent/rolled, deformed or shaped in other manners in order to take up less space, such as if made very long. Often, it is desired that the tracks 14, or the PCB 12, have a length of more than 10 cm, such as longer than 50 cm, such as longer than 100 cm.

In FIG. 4, a coiled shape is seen. When the PCB 12 is coiled, the first side 121 (see FIGS. 2 and 6) with the tracks 14/16/18 faces the second side 122 (see FIGS. 2 and 6) with the layer 20, so that the isolation or shielding, if desired, is maintained. In this manner, the tracks 14 are engageable at one end at the inner portion of the coil and at the other end at the outer portion of the coil. In one embodiment, the filter is bent at the center thereof (as explained below in relation to FIG. 5) and rolled so that both ends of the tracks 14 are engageable from the outer portions of the coil. In this case, however, the first side will be facing the first side, which may not be preferred, at least if no electromagnetically absorbing material is present between the facing first sides.

In FIG. 3, another embodiment of a filter may be seen which has three sections, I, II and III. In the upper illustration, the first side, 121, is seen and in the lower illustration, the other side 122 is seen. Sections I and II are of the type seen in FIG. 1 where the tracks 14, 16 and 18 are provided on the first side 121 and the plane on the second side 122.

In section II, however, the tracks 14, 16 and 18 are provided on the second side 122 and the layer on the first side 121.

Vias 24 are provided for connecting a track 14 in section II with a track 14 in section I and in section III. Vias 22 (see FIGS. 1 and 2) may also be used for connecting the tracks 16 and 18 to the corresponding tracks in the other sectors, but these vias may additionally or alternatively be connected directly to the plane 20 in the neighbouring section.

Clearly, the vias 22 described in relation to FIGS. 1 and 2 for connecting the tracks 16/18 to the plane 20 through the PCB may also be provided.

A filter of this type may be used in a number of manners. One manner is seen in FIG. 5, where a filter with two sections, such as sections I and II of FIG. 3 is provided, where the sections I and II have the same length. The PCB 12 is then folded at the center, i.e. at a position of the vias 24, where after the folded PCB is coiled. In this manner, both outer ends of the tracks 14 are engageable at the outer portions of the coil. In addition, due to this structure of the sections, the folding will have the layer 20 of section II face the tracks 14 of section I (see FIG. 3), so that the coiling again will have the tracks face the layer, so that optimal shielding is obtained. Clearly, also 4, 6 or any other even number, for rolls, of sections may be used.

A preferred manner of interfacing between the sections and the two sides is seen in FIG. 7, in which like reference characters refer to like elements of FIG. 3.

In FIG. 6, another filter structure is seen in which the PCB 12 is zig-zagged or guided over a number of pins 26 each folding the PCB 12 gently by 180 degrees. The equidistant positioning of the pins has the advantage that the distance between the parallel portions of the PCB 12 are equidistant. Alternatively, the pins may be positioned with a lower distance, thereby making the PCB define more wedge-shaped portions, making the overall filter smaller. The pins 26 may be omitted and the PCB folded over itself or over other types of elements. Equidistance may be provided using only the electromagnetically absorbing material, for example. Any number of sections may be used in this context.

In this embodiment, the electromagnetically absorbing material may be fed into a casing also comprising the pins and the PCB. The electromagnetically absorbing material may have a higher or lower viscosity. If the viscosity is low, it may be desired to feed the electromagnetically absorbing material on both sides of the PCB in order to prevent that the PCB ends up in a shape different from a straight line between the pins.

The upper portion of FIG. 6 illustrates how the second side 122 (see FIG. 2) will face the same side after a bend around a pin 26, if no sections are used. Naturally, around the next bend, the first sides 121 (see FIG. 2) will then face each other.

At the lower portion of FIG. 6, it is illustrated how the embodiment of FIG. 3 will act, when the sectors I and II are made to intersect at the pin 26. In this manner, the second side will always face the first side. In this manner, the number of sectors will correspond to the number of parallel portions of the filter in the set-up. In FIG. 6, this number would be 6.

Naturally, the electromagnetically absorbing material is preferred also in the coiled/folded embodiments, but the absorbing material is not required in the situations where the layer of the second surface 122 faces the first layer tracks, as the layer will then perform the shielding function which the electromagnetically absorbing material would perform in the straight case.

In general, the PCB may require or prefer being heated or otherwise softened prior to and/or during bending/folding. The PCB may be rigid or fragile when in room temperature, where the softening may be chemical (addition of a softener, such as oil, phthalates or the like) or heating.

The PCB may have a core material which is permanently deformable, so that the bent/folded state is maintained once provided. Alternatively, the folded/bent shape may be maintained by adhesion, such as by the electromagnetically absorbing material adhering the portions of the PCB in the desired relative positions.

In another alternative embodiment, the absorbing material may be a paint or lacquer which may be applied on the PCB.

In another embodiment, the absorbing material is provided as a slurry of a powder and a liquid. The liquid may be an adhesive, as it may be able to harden or set.

Figure 8:
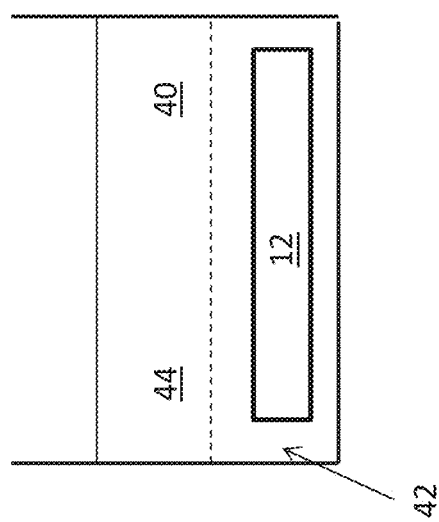
FIG. 8 illustrates a container for providing an absorbing material to a PCB.

The PCB 12, folded/rolled or straight, may be provided in a container (see FIG. 8) into which the slurry 40 is provided. Upon pouring into the container, the powder of the slurry will settle at the bottom and thus around the filter, generating a lower portion 42 with a higher concentration of the powder than the original slurry, and an upper portion 44 with a lower concentration of the powder. Thus, the filter may be provided with (or inside) a material with a high powder concentration.

When the liquid has hardened or set, the portion 44 may be removed if desired, or the absorbing material around the PCB 12 may be machined to arrive at a desired size.

Preferably, the PCB and the signal tracks are cooled to close to 0K. In this connection, the function of the absorbing material may be to absorb energy from electrons travelling in the signal track. This absorbed energy will heat the absorbing material and is preferably removed. The absorbing material may have a high thermal conduction and thus be able to transport such energy to a surface thereof, such as a surface connected to a cooling surface. Alternatively or additionally, cooling elements or thermal conductors may be provided in the absorbing material, such as the layer C of FIG. 6 or a laminated layer between the windings of the coils of FIGS. 4 and 5. This layer C may merely extend inside the absorbing material to distribute or transport the energy therein, such as to a surface of the absorbing material. Alternatively, the layer C may extend to outside of the absorbing material in order for itself to be cooled, such as if connected to a cooling surface.

In FIG. 9, another or an alternative cooling manner may be seen in which the PCB 12 itself is provided with cooling fins 32 which may extend into the absorbing material, if provided also at the width of the PCB, or to the surroundings of the PCB or filter structure to be cooled, such as by connection to a cooling surface. The fins 32 may be connected to the signal track(s) but preferably are extensions of the layer 20 (see FIGS. 2, 3 and 7) so as to be able to cool a larger portion of the PCB.

The invention claimed is:

1. A multi-channel filter comprising:
a printed circuit board comprising:
a plurality of first elongate signal tracks, each first elongate signal track formed by an electrically conducting path on a first surface of the printed circuit board, each first signal track is not galvanically connected to any other first signal track,
one or more first elongate shielding tracks, each first elongate shielding track formed by an electrically conducting or absorbing path on the first surface, where each of the plurality of first elongate signal tracks is separated from a neighboring first elongate signal track by one of the one or more first elongate shielding tracks,
a first electrically conducting or absorbing layer on a second surface of the printed circuit board, the first and second surfaces being opposite surfaces of the printed circuit board, and
a first electromagnetically absorbing material covering the plurality of first elongate signal tracks.

2. The filter according to claim 1, wherein the printed circuit board comprises at least two sections along a longitudinal direction, wherein:
in a first section:
the plurality of first elongate signal tracks and the one or more first elongate shielding tracks are provided at the first surface of the printed circuit board and
the first electrically conducting or absorbing layer is provided on the second surface of the printed circuit board,
in a second section adjacent to the first section, the filter comprises:
a plurality of second elongate signal tracks, each second elongate signal track formed by an electrically conducting path on the second surface of the printed circuit board, each second signal track is not galvanically connected to any other second signal track,
one or more second elongate shielding tracks, each second elongate shielding track formed by an electrically conducting and/or absorbing path on the second surface, where each of the plurality of second elongate signal tracks is separated from a neighboring second elongate signal track by one or more second elongate shielding tracks
a second electrically conducting or absorbing layer on the first surface of the printed circuit board, and
a third electromagnetically absorbing material covering the plurality of second elongate signal tracks, and where a first signal track is connected to a second signal track.

3. The filter according to claim 2, wherein the printed circuit board is folded to form two at least substantially parallel printed circuit board portions.

4. The filter according to claim 2, wherein the printed circuit board is rolled into a roll.

5. The filter according to claim 1, further comprising two first outer elongate shielding tracks, distinct from the one or more first elongate shielding tracks, positioned on the first surface, all first elongate signal tracks and all first elongate shielding tracks being positioned between the two first outer elongate shielding tracks.

6. The filter according to claim 1, further comprising one or more electrical connections between the one or more first elongate shielding tracks and the first electrically conducting or absorbing layer.

7. The filter according to claim 6, wherein at least one of the one or more electrical connections is a connection through the printed circuit board.

8. The filter according to claim 1, further comprising a second electromagnetically absorbing material in contact with the first electrically conducting or absorbing layer.

9. The filter according to claim 8, wherein the first electrically conducting or absorbing layer is electrically conducting and in galvanic contact with the second electromagnetically absorbing material.

10. The filter according to claim 1, wherein the printed circuit board is flexible.

11. The filter according to claim 1, further comprising a first electrically insulating material covering the plurality of first elongate signal tracks.

12. A method of using the filter according to claim 1, the method comprising:
cooling the first electromagnetically absorbing material, the plurality of first elongated signal tracks and the one or more first elongated shielding tracks to a temperature below 110 K, and
feeding signals through the plurality of first elongated signal tracks.

* * * * *